(12) United States Patent
Cao

(10) Patent No.: US 12,126,747 B2
(45) Date of Patent: Oct. 22, 2024

(54) FOLDABLE TERMINAL

(71) Applicant: XI'AN ZHONGXING NEW SOFTWARE CO., LTD., Xi'an (CN)

(72) Inventor: Li Cao, Shenzhen (CN)

(73) Assignee: XI'AN ZHONGXING NEW SOFTWARE CO., LTD., Xi'an (CN)

( * ) Notice: Subject to any disclaimer, the term of this patent is extended or adjusted under 35 U.S.C. 154(b) by 282 days.

(21) Appl. No.: 17/762,981

(22) PCT Filed: Sep. 27, 2020

(86) PCT No.: PCT/CN2020/118136
§ 371 (c)(1),
(2) Date: Mar. 23, 2022

(87) PCT Pub. No.: WO2021/120773
PCT Pub. Date: Jun. 24, 2021

(65) Prior Publication Data
US 2022/0418131 A1 Dec. 29, 2022

(30) Foreign Application Priority Data
Dec. 19, 2019 (CN) .......................... 201911316492.4

(51) Int. Cl.
*H04M 1/02* (2006.01)
*G06F 1/16* (2006.01)
(Continued)

(52) U.S. Cl.
CPC ........ *H04M 1/0268* (2013.01); *G06F 1/1652* (2013.01); *F16C 11/04* (2013.01); *H04M 1/0216* (2013.01); *H05K 5/0226* (2013.01)

(58) Field of Classification Search
CPC .......................... H04M 1/0268; G06F 1/1652
See application file for complete search history.

(56) References Cited

U.S. PATENT DOCUMENTS 10,146,260 B2 * 12/2018 Lee ...................... H05K 5/0017
10,788,861 B2 * 9/2020 Han ...................... G06F 1/1641
(Continued)

FOREIGN PATENT DOCUMENTS

CN 102123187 A 7/2011
CN 104461444 A 3/2015
(Continued)

OTHER PUBLICATIONS

European Patent Office. Extended European Search Report for EP Application No. 20903554.2, mailed Oct. 18, 2022, pp. 1-9.
(Continued)

*Primary Examiner* — Nidhi Thaker
(74) *Attorney, Agent, or Firm* — Vivacqua Crane, PLLC

(57) ABSTRACT

A foldable terminal is disclosed, which may include a first storage rotation shaft, a second storage rotation and a flexible screen. One end of the flexible screen is connected and fixed to the first storage rotation shaft, and the other end of the flexible screen is connected and fixed to the second storage rotation shaft. And a portion of the flexible screen is wound around at least one of the first storage rotation shaft and the second storage rotation shaft. In response to the flexible screen being folded, the first storage rotation shaft is rotatable to release the flexible screen, and in response to the flexible screen being unfolded, the second storage rotation shaft is rotatable to roll up the flexible screen.

8 Claims, 6 Drawing Sheets

(51) Int. Cl.
*F16C 11/04* (2006.01)
*H05K 5/02* (2006.01)

(56) References Cited

U.S. PATENT DOCUMENTS

| | | | | |
|---|---|---|---|---|
| 2014/0321074 A1* | 10/2014 | Chida | ............ | G09F 9/35 361/749 |
| 2015/0029229 A1* | 1/2015 | Voutsas | ............ | G06F 1/1647 345/1.3 |
| 2016/0381812 A1 | 12/2016 | Dong | | |
| 2018/0267571 A1* | 9/2018 | Chen | ............ | G06F 1/1641 |
| 2019/0302848 A1* | 10/2019 | Han | ............ | G06F 1/1641 |

FOREIGN PATENT DOCUMENTS

| | | | | | |
|---|---|---|---|---|---|
| CN | 107135288 A | | 9/2017 | | |
| CN | 109639864 A | * | 4/2019 | ............ | H04M 1/026 |
| CN | 110191207 A | | 8/2019 | | |
| CN | 110233918 A | | 9/2019 | | |
| CN | 111182090 A | * | 5/2020 | ............ | H04M 1/026 |
| CN | 112652246 A | * | 4/2021 | ............ | G05D 3/20 |
| CN | 112887465 A | * | 6/2021 | ............ | H04M 1/0214 |
| WO | 2017057783 A1 | | 4/2017 | | |
| WO | 2017114469 A1 | | 7/2017 | | |

OTHER PUBLICATIONS

International Searching Authority. International Search Report and Written Opinion for PCT Application No. PCT/CN2020/118136 and English translation, mailed Dec. 30, 2020, pp. 1-12.

\* cited by examiner

FOLDABLE TERMINAL

CROSS-REFERENCE TO RELATED APPLICATION

The present application is a national stage filing under 35 U.S.C. § 371 of international application number PCT/CN2020/118136, filed on Sep. 27, 2020, which claims priority to the Chinese Patent Application No. 201911316492.4 filed on Dec. 19, 2019, the entire contents of which are incorporated herein by reference.

TECHNICAL FIELD

Embodiments of the present disclosure relate to the field of electronic devices, and in particular, to a foldable terminal.

BACKGROUND

With the continuous development of display technologies, screens of different sizes are equipped in various terminal products. Large-screen terminals can bring users better audio-visual enjoyment of surfing the Internet and playing games, but are not easy to carry; and small-screen terminals are easy to carry, but have bad experience when surfing the Internet, playing games and making video calls. Therefore, a terminal that can change a display area according to the user's needs is demanded, which can integrate the dual advantages of the sensory enjoyment of a large screen and the convenience in carrying a small screen. In order to meet this demand, a foldable smart terminal having a flexible screen is provided. The flexible screen can be bent freely, such that a smart display terminal product can get rid of an inherent rigid structure. The flexible screen terminal can change the size of an actual display area according to the user's needs, such that it can integrate the dual advantages of the sensory enjoyment of a large screen and the convenience in carrying a small screen, thus has become an important development direction of smart terminal products.

SUMMARY

In some embodiments, the present disclosure provides a foldable terminal, including a first storage rotation shaft, a second storage rotation shaft and a flexible screen. One end of the flexible screen is connected and fixed to the first storage rotation shaft, and the other end of the flexible screen is connected and fixed to the second storage rotation shaft. A portion of the flexible screen is wound around at least one of the first storage rotation shaft and the second storage rotation shaft. And in response to that the flexible screen is folded, the first storage rotation shaft is rotatable to release the flexible screen, and in response to that the flexible screen is unfolded, the second storage rotation shaft is rotatable to roll up the flexible screen.

BRIEF DESCRIPTION OF DRAWINGS

One or more embodiments are exemplified by the corresponding figures in the accompanying drawings. These exemplified descriptions do not constitute a limitation on the embodiments. Elements in the accompanying drawings with the same reference numeral are denoted as similar elements. Unless otherwise specified, the figures in the accompanying drawings do not constitute a scale limitation.

DETAILED DESCRIPTION

In order to make the objectives, technical schemes and advantages of the embodiments of the present disclosure clearer, a further detailed description will be made to the embodiments of the present disclosure below with reference to the accompanying drawings. However, it is to be understood by a person having ordinary skills in the art that in each embodiment of the present disclosure, many technical details are provided to enable the reader to better understand the present disclosure. However, the technical schemes claimed in the present disclosure can be achieved even without these technical details and various changes and modifications based on the following embodiments. The following divisions of various embodiments are for the convenience of description, and should not constitute any limitation on the specific implementation of the present disclosure, and the various embodiments may be combined with each other and referred to each other if not contradicted.

A foldable flexible screen of the existing flexible screen terminal has a fixed length, where the flexible screen will be stretched and squeezed during flattening and folding processes, which will cause the flexible screen to be easily damaged by tensile force and pressure, thereby shortening the service life of the flexible screen. The objective of some embodiments of the present disclosure is to provide a foldable terminal whose flexible screen will not be stretched and squeezed during the folding and flattening processes, thereby prolonging the service life of the flexible screen.

In an embodiment, the present disclosure relates to a foldable terminal, which can be any terminal device, such as a mobile phone, a tablet computer, a notebook computer, a wearable device, or the like.

Figure 1:
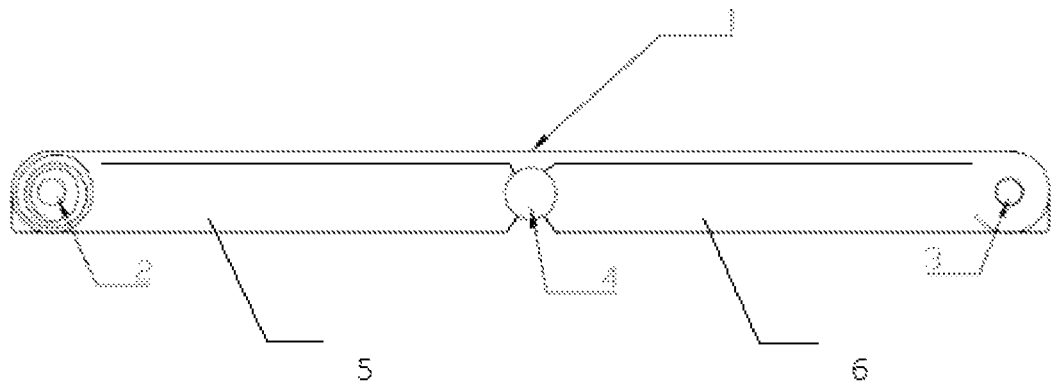
FIG. 1 is a schematic diagram of a foldable terminal according to an embodiment of the present disclosure.
Figure 2:
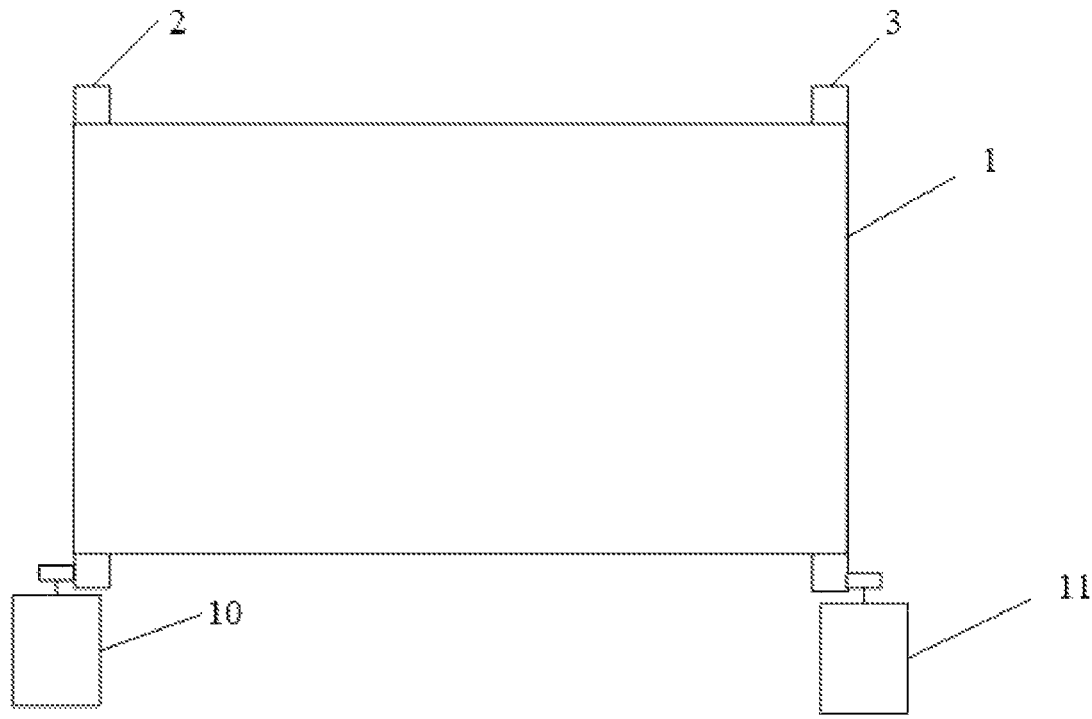
FIG. 2 is a schematic diagram illustrating the connection of a motor according to the embodiment of the present disclosure.

As shown in FIG. 1, the foldable terminal includes a flexible screen 1, a first storage rotation shaft 2, a second storage rotation shaft 3, a foldable rotation shaft 4, a first housing 5 and a second housing 6. One end of the flexible screen 1 is connected and fixed to the first storage rotation shaft 2, and the flexible screen 1 is partially wound around the first storage rotation shaft 2. When the flexible screen 1 is bent, folded or unfolded, the first storage rotation shaft 2 is rotatable to release or roll up the flexible screen 1. The first storage rotation shaft 2 and the second storage rotation shaft 3 are provided in parallel side by side, the other end of the flexible screen 1 is connected and fixed to the second storage rotation shaft 3, and the flexible screen 1 is partially wound around at least one of the first storage rotation shaft 2 and the second storage rotation shaft 3. When the flexible screen 1 is folded, the first storage rotation shaft 2 is rotatable to release the flexible screen 1. When the flexible screen 1 is unfolded, the second storage rotation shaft 3 is rotatable to roll up the flexible screen 1, such that the two rotation shafts can implement the release and roll-up actions by turns, such that the length of the flexible screen 1 can be adjusted during the folding process for unlimited times. An edge of the first storage rotation shaft 2 is connected to a first motor 10, the motor 10 drives the first storage rotation shaft 2 to rotate by driving an end of the first storage rotation shaft 2 to rotate. And an edge of the second storage rotation shaft 3 is connected to a second motor 11, and the motor 11 drives the second storage rotation shaft 3 to rotate by driving an end of the second storage rotation shaft 3 to rotate, as shown in FIG. 2.

It should be noted that each of the first storage rotation shaft 2 and the second storage rotation shaft 3 is a bidirectional rotation shaft, such that the first storage rotation shaft 2 and the second storage rotation shaft 3 are both rotatable in a forward or reverse direction at any time to implement the release and roll-up actions by turns.

It should be noted that the first housing 5 and the second housing 6 are pivotally connected via the foldable rotation shaft 4, and the foldable rotation shaft 4 is located between the first housing 5 and the second housing 6, such that each of the first housing 5 and the second housing 6 is rotatable around the foldable rotation shaft 4. The first storage rotation shaft 2 is provided in an internal space of the first housing 5, and the second storage rotation shaft 3 is provided in an internal space of the second housing 6. For ease of understanding and description, this embodiment is described by taking the first storage rotation shaft 2 being provided at the edge of the internal space of the first housing 5 and the second storage rotation shaft 3 being provided at the edge of the internal space of the second housing 6 as examples, such that there is a large space between the first storage rotation shaft 2 and the second storage rotation shaft 3 to place other components. The positions of the first storage rotation shaft 2 and the second storage rotation shaft 3 in the internal spaces of the first housing 5 and the second housing 6 are not limited specifically in this embodiment.

Figure 3:
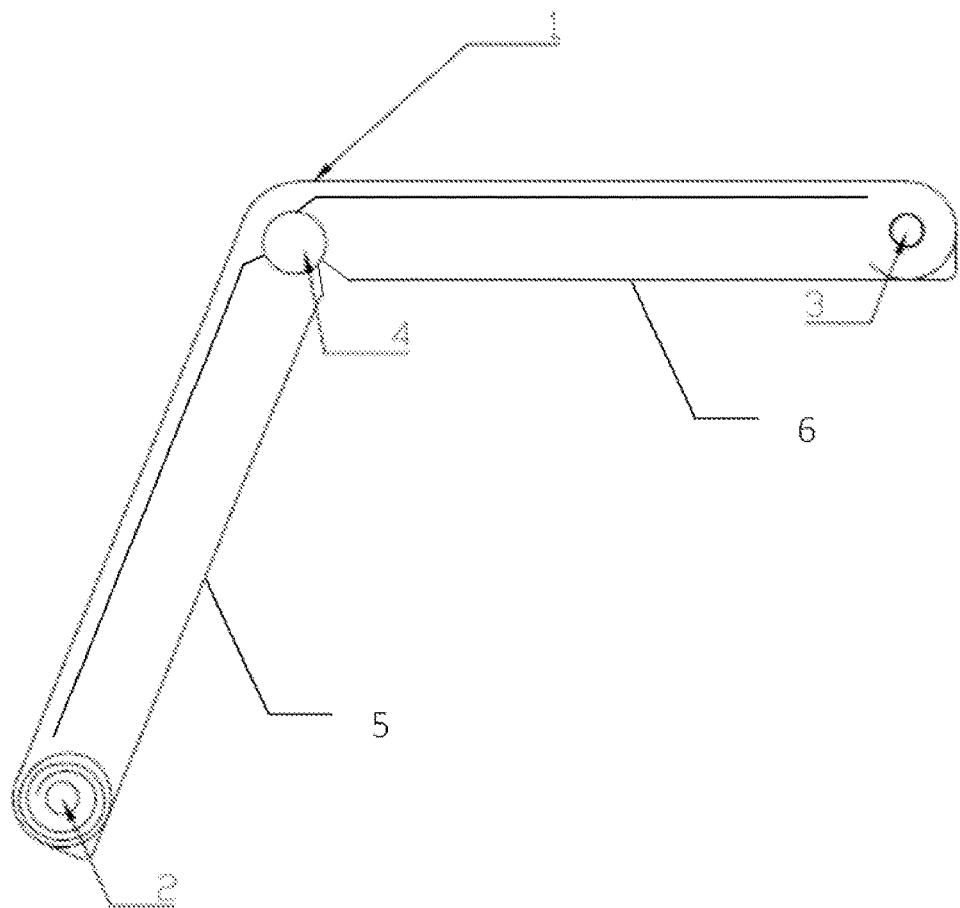
FIG. 3 is a schematic diagram illustrating first-time folding of the foldable terminal according to the embodiment of the present disclosure.
Figure 4:
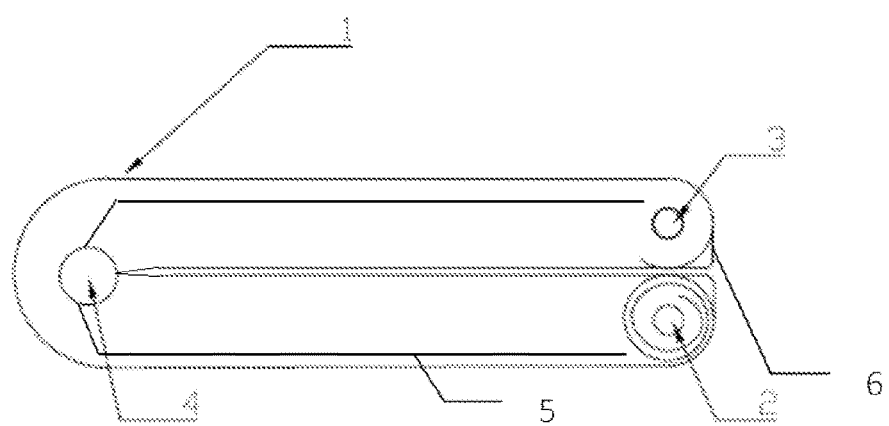
FIG. 4 is a schematic diagram illustrating the completion of first-time folding of the foldable terminal according to the embodiment of the present disclosure.

As shown in FIG. 1, in an initial state, a portion of the flexible screen 1 is wound around the first storage rotation shaft 2, and the rest of the flexible screen is wound around the second storage rotation shaft 3. The process of folding the foldable terminal from a flattened state to a folded state is shown in FIG. 3. At this time, the first storage rotation shaft 2 is located on the left side of a user, the second storage rotation shaft 3 is located on the right side of the user, the flexible screen 1 faces upwards, and the first housing 5 rotates counterclockwise around the foldable rotation shaft 4. The flexible screen 1 is bent and folded around the foldable rotation shaft 4. Due to the bending and stretching of the flexible screen 1 in a bending and folding region, a tensile force on the flexible screen 1 gradually increases. The first motor 10 drives the first storage rotation shaft 2 to rotate clockwise to releases the flexible screen 1 by a partial length, and increase the surface length of the flexible screen 1, so as to relieve the tensile force on the flexible screen 1, such that the flexible screen 1 will be finally folded to a state shown in FIG. 4, without any damage.

Figure 5:
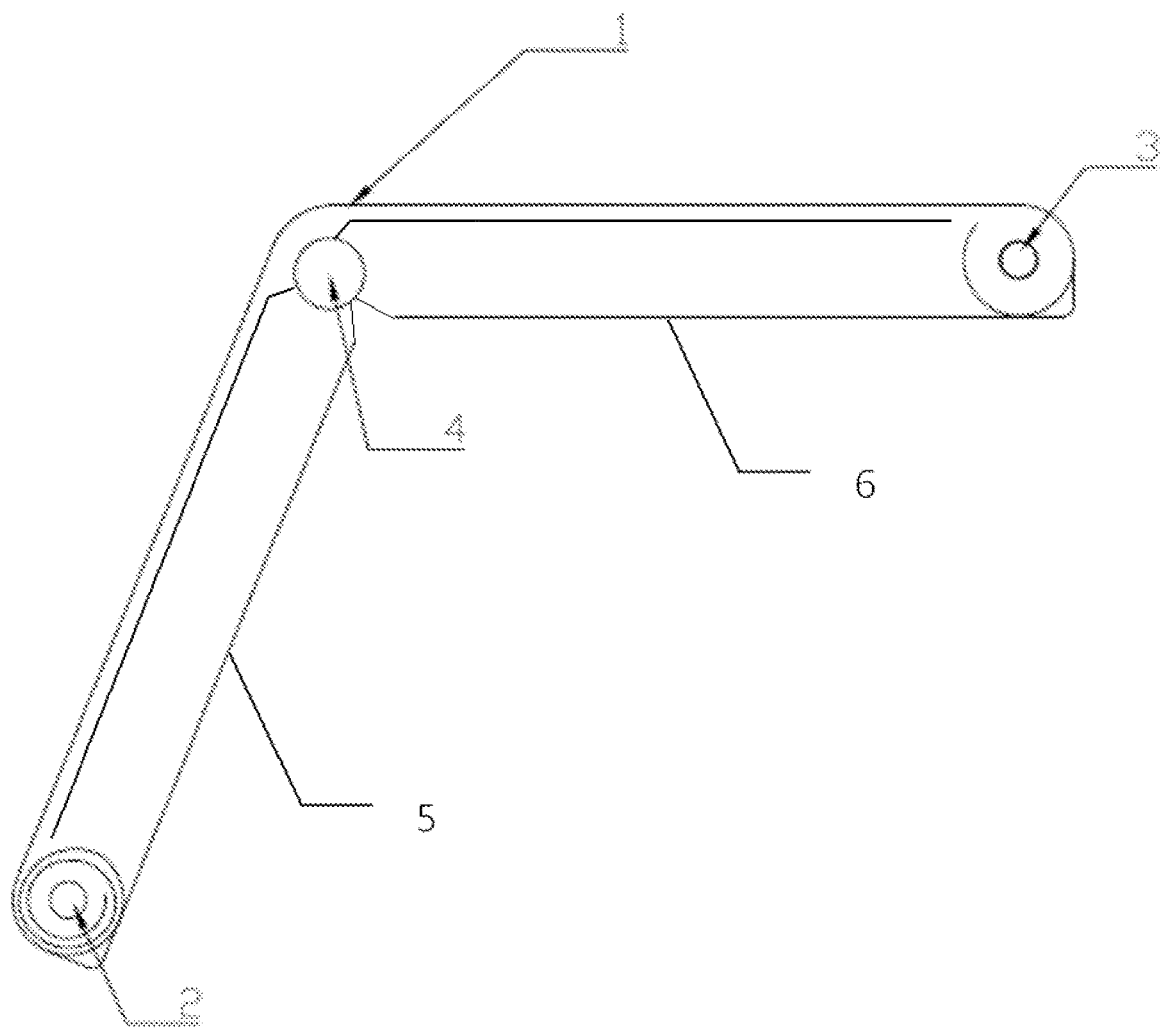
FIG. 5 is a schematic diagram illustrating first-time flattening of the foldable terminal according to the embodiment of the present disclosure.
Figure 6:
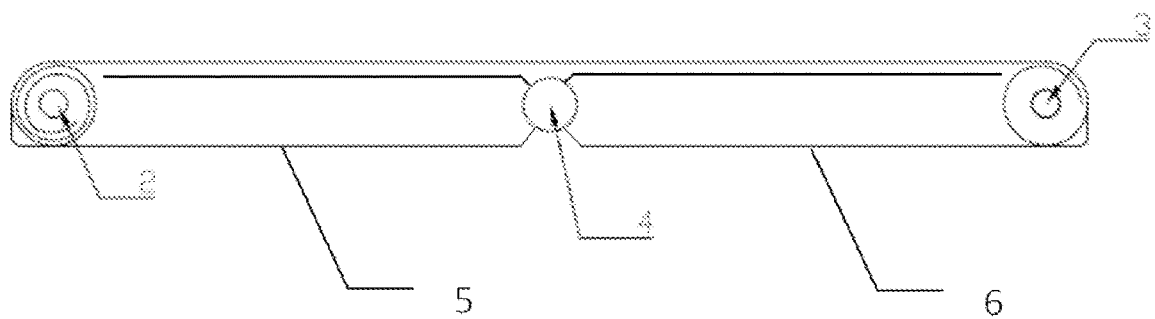
FIG. 6 is a schematic diagram illustrating the completion of first-time flattening of the foldable terminal according to the embodiment of the present disclosure.

As shown in FIG. 5, when the foldable terminal needs to be flattened to a flattened state from the folded state, the first housing 5 rotates clockwise around the foldable rotation shaft 4. During the process from folding to flattening, the originally elongated flexible screen 1 tends to become shorter, a squeezing force on both sides of the flexible screen 1 gradually increases, and the second motor 11 drives the second storage rotation shaft 3 to rotate clockwise; and at the same time, a portion of the flexible screen 1 is gradually wound around the second storage rotation shaft 3, such that the surface length of the flexible screen 1 decreases, so as to relieve the pressure on the flexible screen 1, and therefore, the flexible screen 1 is finally flattened to a state shown in FIG. 6, without any damage.

Figure 7:
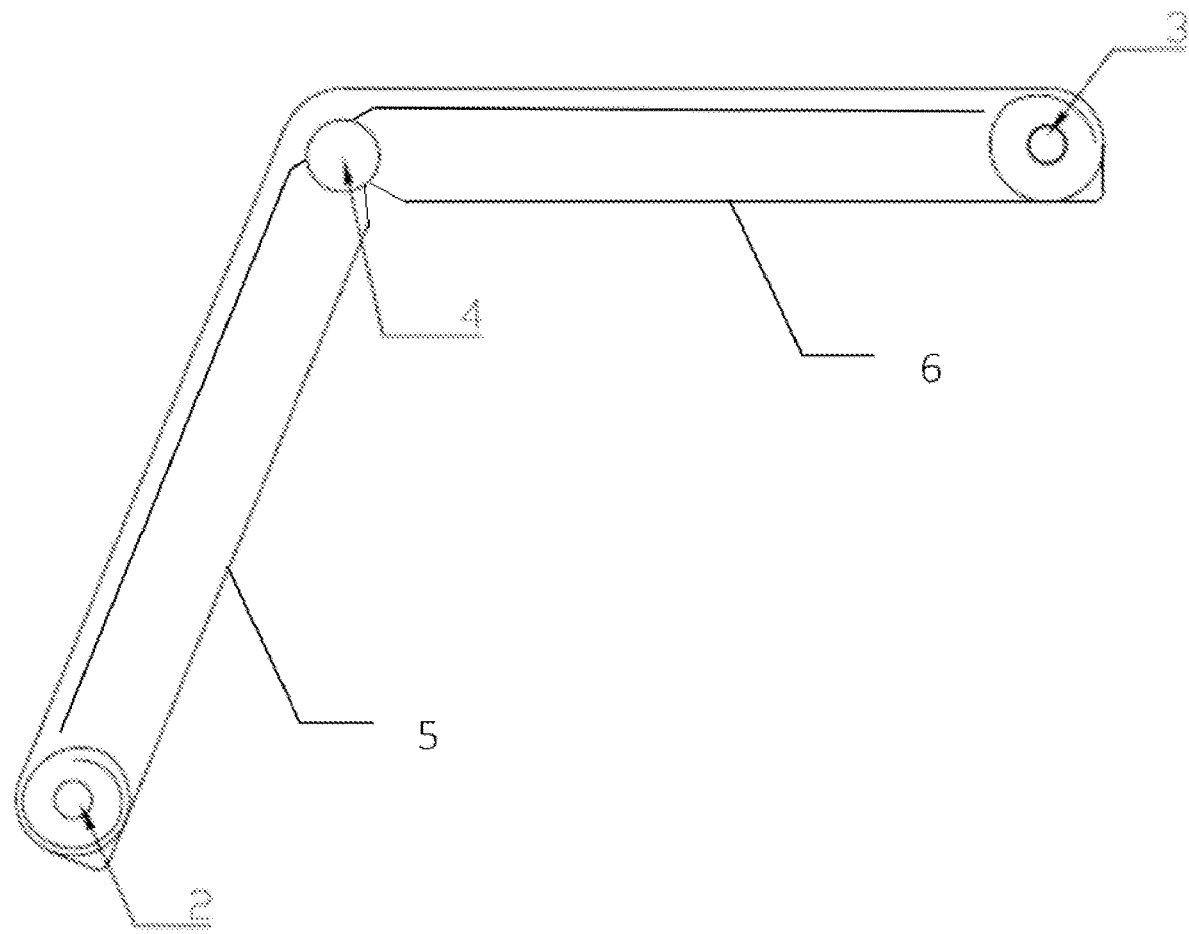
FIG. 7 is a schematic diagram illustrating second-time folding of the foldable terminal according to the embodiment of the present disclosure.
Figure 8:
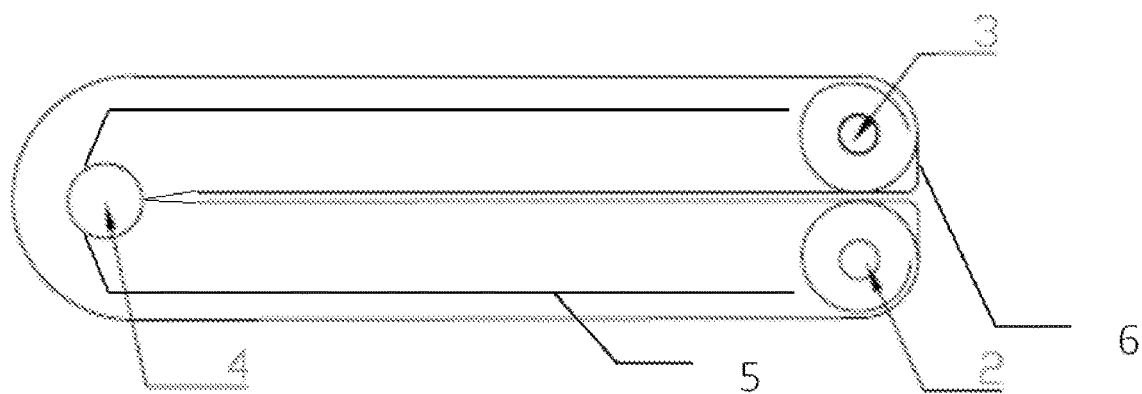
FIG. 8 is a schematic diagram illustrating the completion of second-time folding of the foldable terminal according to the embodiment of the present disclosure.

As shown in FIG. 7, when the foldable terminal needs to be folded again, the left half portion of the foldable terminal with the flexible screen, that is, the first housing 5 rotates counterclockwise around the foldable rotation shaft 4. During the process from flattening to folding, a tensile force on the flexible screen 1 gradually increases. The first motor 10 drives the first storage rotation shaft 2 to rotate clockwise to releases the flexible screen 1 by a partial length, and increase the surface length of the flexible screen 1, so as to relieve the tensile force on the flexible screen 1, such that the flexible screen 1 will be finally folded to a state shown in FIG. 8, without any damage.

Figure 9:
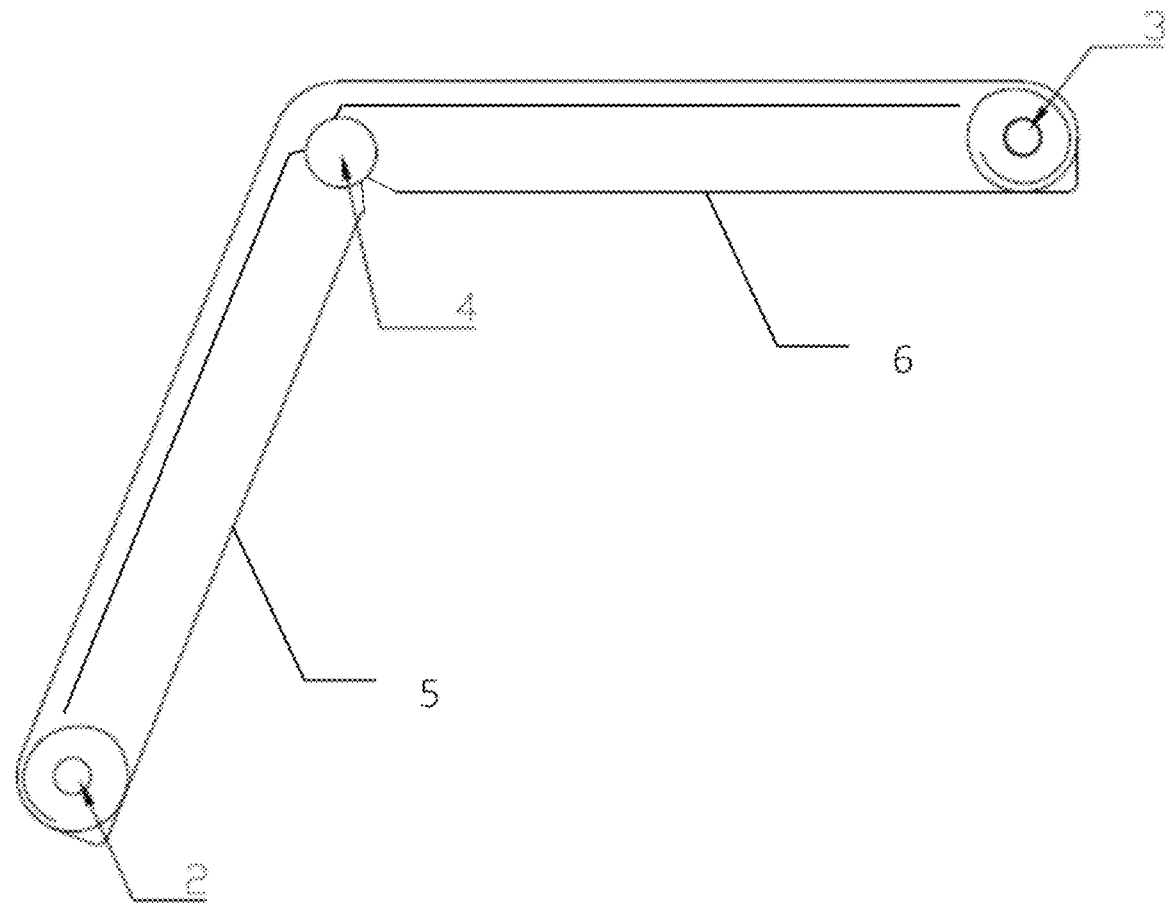
FIG. 9 is a schematic diagram illustrating second-time flattening of the foldable terminal according to the embodiment of the present disclosure.
Figure 10:
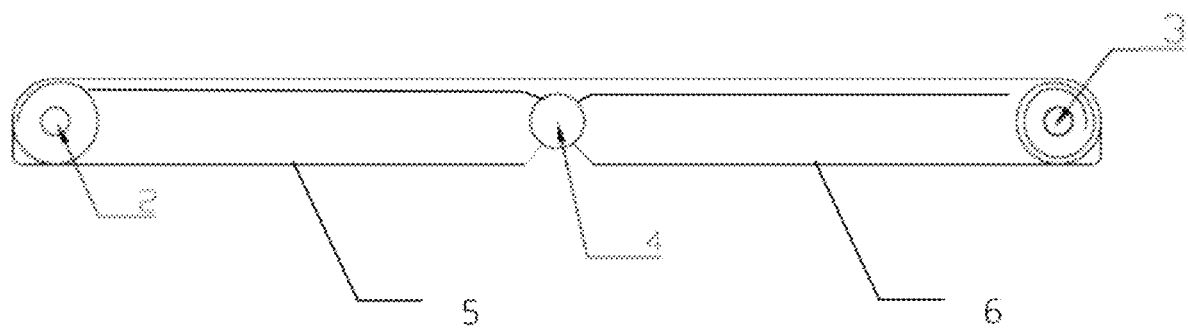
FIG. 10 is a schematic diagram illustrating the completion of second-time flattening of the foldable terminal according to the embodiment of the present disclosure.

As shown in FIG. 9, when the foldable terminal needs to be flattened again, the first housing 5 rotates clockwise around the foldable rotation shaft 4. During the process from folding to flattening, a squeezing force on both sides of the flexible screen 1 gradually increases, and the second motor 11 drives the second storage rotation shaft 3 to rotate clockwise; and at the same time, a portion of the flexible screen 1 is gradually wound around the second storage rotation shaft 3, such that the surface length of the flexible screen 1 decreases, so as to relieve the pressure on the flexible screen 1 during the process from folding to flattening, and therefore, the flexible screen 1 will be finally flattened to a state shown in FIG. 10, without any damage.

As shown in FIGS. 3 to 10, after each folding, the first storage rotation shaft 2 will release a portion of the flexible screen 1 wound thereon. After undergoing flattening again, a portion of the flexible screen 1 will be wound around the second storage rotation shaft 3 and be folded. When the portion of the flexible screen 1 wound around the first storage rotation shaft 2 is completely released, the wound portion of the flexible screen 1 is completely wound on the second storage rotation shaft 3. At this time, the rotation directions of the first motor 10 and the second motor 11 are changed, and after each folding, the second storage rotation shaft 3 will release a portion of the flexible screen 1 wound thereon; after undergoing flattening again, a portion of the flexible screen 1 will be wound around the first storage rotation shaft 2 and be folded. Such cycle of folding and folding is repeated. In addition, during multiple folding and flattening processes, the flexible screen 1 is gradually transferred from one side of the first storage rotation shaft 2 to one side of the second storage rotation shaft 3, or gradually transferred from one side of the second storage rotation shaft 3 to one side of the first storage rotation shaft 2. In each bending and folding process before the rotation directions of the rotation shafts are switched, different regions of the flexible screen 1 are bent, so as to reduce a fatigue damage caused by bending in a fixed region.

It should be noted that, for ease of understanding and explanation, this embodiment is described by taking the flexible screen 1 being folded around the foldable rotation shaft 4 in a direction away from the folding direction of the flexible screen as an example. After the folding is completed, the first housing 5 and the second housing 6 are in contact with each other. In practical applications, the flexible screen 1 can also be folded relatively around the foldable rotation shaft 4, that is, the left and right portions of the flexible screen 1 are in contact with each other after the folding is completed. The folding direction of the flexible screen 1 is not specifically limited in this embodiment.

To sum up, in this embodiment, by using the first storage rotation shaft 2 and the second storage rotation shaft 3 to cooperate with each other, in each folding and flattening process, the flexible screen 1 is released and rolled up by turns, which not only alleviates the tensile force and pressure on the flexible screen 1 due to stretching and squeezing during each folding and flattening process and also make the flexible screen 1 move cyclically between the first storage rotation shaft 2 and the second storage rotation shaft 3, such that a bending region of the flexible screen 1 is changeable at each time, thereby solving the problem of local fatigue damage of the flexible screen.

In some embodiments of the present disclosure, by winding the flexible screen around the first storage rotation shaft, the flexible screen is released by the first storage rotation shaft by a certain length when the flexible screen is bent and folded, and the flexible screen is rolled up by the second storage rotation shaft by a certain length when the flexible screen is unfolded, to adjust the length of the flexible screen in time. Therefore, when the flexible screen is bent and folded under a tensile force, the flexible screen can be released to relieve the tensile force, and when the flexible screen is bent and folded under a pressure, the flexible screen can be folded to relieve the pressure, so as to protect the flexible screen from damage. The problem that the flexible screen will be damaged by the tensile force and pressure when it is flattened and folded in some cases is solved, and the service life of the flexible screen is greatly prolonged.

In another embodiment, the present disclosure relates to a foldable terminal. This embodiment is roughly the same as the above embodiment, with the main difference residing in that: in this embodiment of the present disclosure, the flexible screen 1 is provided with a stress detection layer 7. The first motor 10 and the second motor 11 are connected to the stress detection layer 7, respectively, and rotation angles of the motors are controlled according to a stress detection result, thereby a released or folded length of the flexible screen 1 is controlled.

It should be noted that, for ease of understanding and explanation, this embodiment is described by taking the stress detection layer 7 being attached to the back of the flexible screen 1 as an example. The arrangement of the stress detection layer 7 is not limited specifically in this embodiment.

Figure 11:
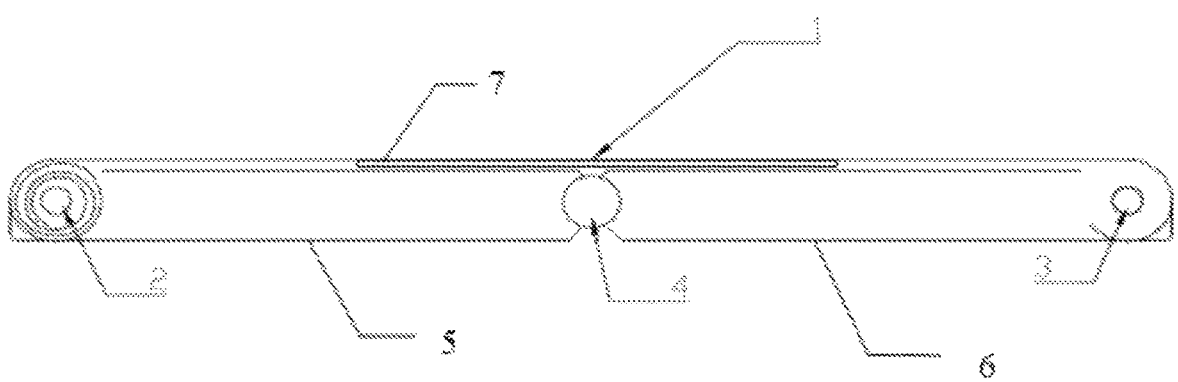
FIG. 11 is a schematic diagram of a foldable terminal according to another embodiment of the present disclosure.

As shown in FIG. 11, during the process from flattening to folding of the foldable terminal with the flexible screen, the tensile force on the flexible screen 1 gradually increases, and the stress detection layer 7 will detect the tensile force on the flexible screen 1 in real time. When the tensile force on the flexible screen 1 exceeds a safety threshold set by the system, the first motor 10 will drive the first storage rotation shaft 2 to rotate, and at the same time gradually release the flexible screen 1 wound thereon until the tensile force on the flexible screen 1 is lower than the safety threshold sent by the system. Thus, the surface length of the flexible screen 1 increases, ensuring that during the process from flattening to folding, the tensile force on the flexible screen 1 is always less than the safety threshold set by the system, such that the flexible screen 1 will not be damaged.

During the process from folding to flattening of the foldable terminal with the flexible screen, a squeezing force on both sides of the flexible screen 1 gradually increases, and the stress detection layer will detect the tensile force on the flexible screen 1 in real time. When the squeezing force on the flexible screen 1 exceeds a safety threshold set by the system, the second motor 10 will drive the second storage rotation shaft 3 to rotate, and at the same time gradually wind the portion of the flexible screen 1 wound around the second storage rotation shaft 3 until the tensile force on the flexible screen 1 is lower than the safety threshold sent by the system. Thus, the surface length of the flexible screen 1 decreases, ensuring that during the process from folding to flattening, the squeezing force on the flexible screen 1 is always less than the safety threshold set by the system, such that the flexible screen 1 will not be damaged.

In this embodiment, by providing the stress detection layer 7 on the back of the flexible screen 1, the magnitude of the stress on the flexible screen 1 can be monitored at any time. Once it is found that the stress on the flexible screen 1 is greater than the set safety threshold, the first motor 10 will drive the first storage rotation shaft 2 to rotate or the second motor 11 drives the second storage rotation shaft 3 to rotate, such that the flexible screen 1 is adjusted in time. By connecting the stress detection layer with the first motor 10 and the second motor 11, the motors are controlled according to the stress detection result, such that the first storage rotation shaft 2 and the second storage rotation shaft 3 are controlled to rotate. When it is detected that the tensile force or pressure reaches a preset value, the flexible screen 1 is loosened or tightened again, so as to ensure that the flexible screen can be released and rolled up within a tolerance range of the flexible screen 1.

In yet another embodiment, the present disclosure relates to a foldable terminal. This embodiment is roughly the same as the first embodiment, with the main difference residing in that: in this embodiment of the present disclosure, there is an opening slit 9 at the joint between the flexible screen 1 and the first housing 5 and at the joint between the flexible screen 1 and the second housing 6, respectively. A silicone sealing layer 8 is provided at each opening slit 9, and is connected to the first housing 5 and the second housing 6 by means of gluing or dispensing. One end of the flexible screen 1 extends into the first housing 5 through the opening slit 9 of the first housing 5 so as to be connected and fixed to the first storage rotation shaft 2, and the other end of the flexible screen 1 extends into the second housing 6 through the opening slit 9 of the first housing 6 so as to be connected and fixed to the second storage rotation shaft 3.

Figure 12:
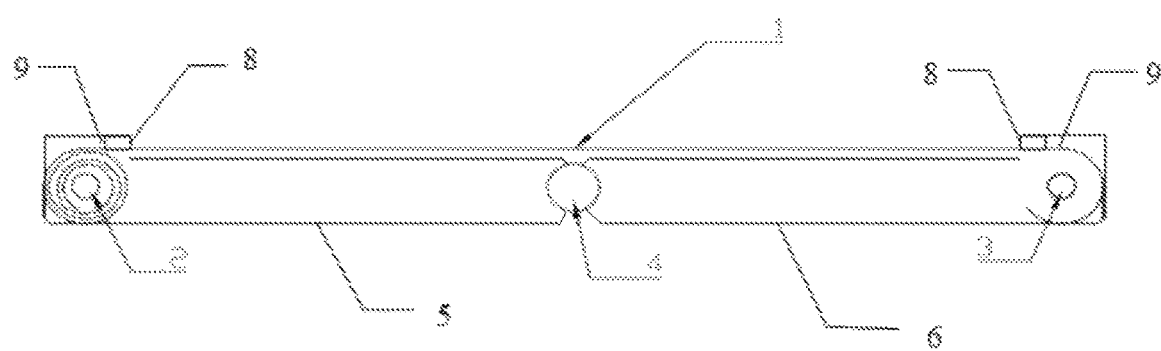
FIG. 12 is a schematic diagram of a foldable terminal according to yet another embodiment of the present disclosure.

As shown in FIG. 12, a joint gap 9 is provided at the joint between the flexible screen 1 and the first housing 5 and at the joint between the flexible screen 1 and the second housing 6, respectively, such that water or dust in the external space may enter into the foldable terminal through these joint gaps, resulting in damage and failure of internal components of the foldable terminal, and thus causing loss. In this embodiment, the silicone sealing layer 8 is provided at the joint gap between each housing and the flexible screen 1, to isolate the internal space of the foldable terminal from the external space and achieve the purpose of waterproofing and dustproofing. The silicone sealing layer 8 is adhered to the inner wall of each of the first housing 5 and the second housing 6 by means of gluing or dispensing to seal the opening slit 9. The opening slit 9 is a gap between the flexible screen 1 and the inner wall of each of the first housing 5 and the second housing 6.

In this embodiment, by providing the silicone sealing layer 8 at the joint between the flexible screen 1 and the first housing 5 and at the joint between the flexible screen 1 and the second housing 6, respectively, the internal components of the foldable terminal can be protected from being polluted by external water and dust, thereby prolonging the life of the foldable terminal better.

The steps of the above various methods are divided only for the purpose of describing clearly. During implementation, they can be combined into one step or some steps can be split and decomposed into multiple steps as long as the same logical relationship is included, all of which are within the protection scope of this patent.

A person having ordinary skills in the art can understand that the above-mentioned embodiments are specific embodiments for implementing the present disclosure. However, in practical applications, various changes can be made in form and details without departing from the scope of the present disclosure.

The invention claimed is:

1. A foldable terminal, comprising: a first storage rotation shaft, a second storage rotation shaft and a flexible screen, wherein: one end of the flexible screen is connected and fixed to the first storage rotation shaft, and the other end of the flexible screen is connected and fixed to the second storage rotation shaft; and a portion of the flexible screen is wound around at least one of the first storage rotation shaft and the second storage rotation shaft; and in response to the flexible screen being folded, the first storage rotation shaft is rotatable to release the flexible screen, and in response to the flexible screen being unfolded, the second storage rotation shaft is rotatable to roll up the flexible screen; after the portion of the flexible screen wound around the first storage rotation shaft is released, and in response to the flexible screen being folded, the second storage rotation shaft is rotatable to release the flexible screen; and in response to the flexible screen being unfolded, the first storage rotation shaft is rotatable to roll up the flexible screen; and after the portion of the flexible screen wound around the second storage rotation shaft is released, and in response to the flexible screen being folded, the first storage rotation shaft is rotatable to release the flexible screen, and in response to the flexible screen being unfolded, the second storage rotation shaft is rotatable to roll up the flexible screen; wherein the foldable terminal further comprises a first motor connected to an edge of the first storage rotation shaft, and a second motor connected to an edge of the second storage rotation shaft, wherein the first motor and the second motor are connected to a stress detection layer, respectively, and the first motor and the second motor control rotation speeds and rotation angles of the first storage rotation shaft and the second storage rotation shaft according to a detection result of the stress detection layer, and wherein the first motor and the second motor are further configured to control rotation directions of the first storage rotation shaft and the second storage rotation shaft.

2. The foldable terminal of claim 1, wherein each of the first storage rotation shaft and the second storage rotation shaft is a bidirectional rotation shaft.

3. The foldable terminal of claim 1, wherein the flexible screen is provided with the stress detection layer.

4. The foldable terminal of claim 1, wherein after the portion of the flexible screen wound around the first storage rotation shaft is released, and in response to the flexible screen being folded or unfolded, the rotation direction of the first storage rotation shaft is changed by the first motor to roll up the flexible screen; and after the portion of the flexible screen wound around the second storage rotation shaft is released, and in response to the flexible screen being folded or unfolded, the rotation direction of the second storage rotation shaft is changed by the second motor to roll up the flexible screen.

5. The foldable terminal of claim 4, wherein the first storage rotation shaft and the second storage rotation shaft are provided in parallel.

6. The foldable terminal of claim 1, further comprising a foldable rotation shaft, wherein:
the foldable rotation shaft is provided in parallel with the first storage rotation shaft and the second storage rotation shaft, respectively and provided between the first storage rotation shaft and the second storage rotation shaft, and the flexible screen is bent and folded around the foldable rotation shaft.

7. The foldable terminal of claim 6, further comprising a first housing and a second housing which are pivotally connected via the foldable rotation shaft, wherein:
the first storage rotation shaft is provided in an internal space of the first housing, and
the second storage rotation shaft is provided in an internal space of the second housing.

8. The foldable terminal of claim 7, wherein the first housing and the second housing are each provided with an opening slit; the flexible screen extends into the first housing through the opening slit of the first housing to be connected and fixed to the first storage rotation shaft; the flexible screen extends into the second housing through the opening slit of the second housing to be connected and fixed to the second storage rotation shaft; and a silicone sealing layer is provided at each of the opening slits.

* * * * *